United States Patent [19]

Watanabe

[11] Patent Number: 5,161,220

[45] Date of Patent: Nov. 3, 1992

[54] DATA WRITE CONTROL CIRCUIT HAVING WORD LENGTH CONVERSION FUNCTION

[75] Inventor: Yoshitaka Watanabe, Ooita, Japan

[73] Assignee: Kabushiki Kaisha Toshiba, Kawasaki, Japan

[21] Appl. No.: 542,599

[22] Filed: Jun. 25, 1990

[30] Foreign Application Priority Data

Jun. 26, 1989 [JP] Japan ................. 1-163194

[51] Int. Cl.[5] .................. G06F 7/00; G06F 9/15
[52] U.S. Cl. .................. 395/425; 395/150; 395/151; 395/162; 395/164; 395/165; 395/400; 364/DIG. 1; 340/735; 340/748; 340/750; 340/789; 365/230.06
[58] Field of Search ... 364/200 MS File, 900 MS File; 395/425 MS File, 117, 150, 151, 162, 163, 164; 340/730, 735, 748, 750

[56] References Cited

U.S. PATENT DOCUMENTS

| | | | |
|---|---|---|---|
| 3,996,566 | 12/1976 | Moran | 340/172.5 |
| 4,555,191 | 11/1985 | Gojo | 340/735 |
| 4,779,223 | 10/1988 | Asai et al. | 364/900 |
| 4,829,460 | 5/1989 | Ito | 364/200 |

Primary Examiner—Joseph L. Dixon
Assistant Examiner—Frank J. Asta
Attorney, Agent, or Firm—Finnegan, Henderson, Farabow, Garrett and Dunner

[57] ABSTRACT

A rotation controller performs bit rotation in units of 2 bits for 8-bit data supplied from a common data bus in accordance with a mode selection signal from a mode selector and a column selection state of a column decoder and outputs the 8-bit data. The data bit-rotated by the rotation controller is supplied to a RAM via first, second, and third I/O gate blocks each having gates of 8 bits connected to a corresponding one of first, second, and third 8-bit column arrays of the RAM. First to third gate controllers are selectively activated by the column decoder. When a 6-bit write mode is selected by the mode selection signal from the mode selector, the first gate controller activates only gates of 6 upper bits in the first I/O gate block, the second gate controller activates only gates of 2 lower bits in the first I/O gate block and gates of 4 upper bits in the second I/O gate block, and the third gate controller activates only gates of 4 lower bits in the second I/O gate block and gates of 2 upper bits in the third I/O gate block.

7 Claims, 7 Drawing Sheets

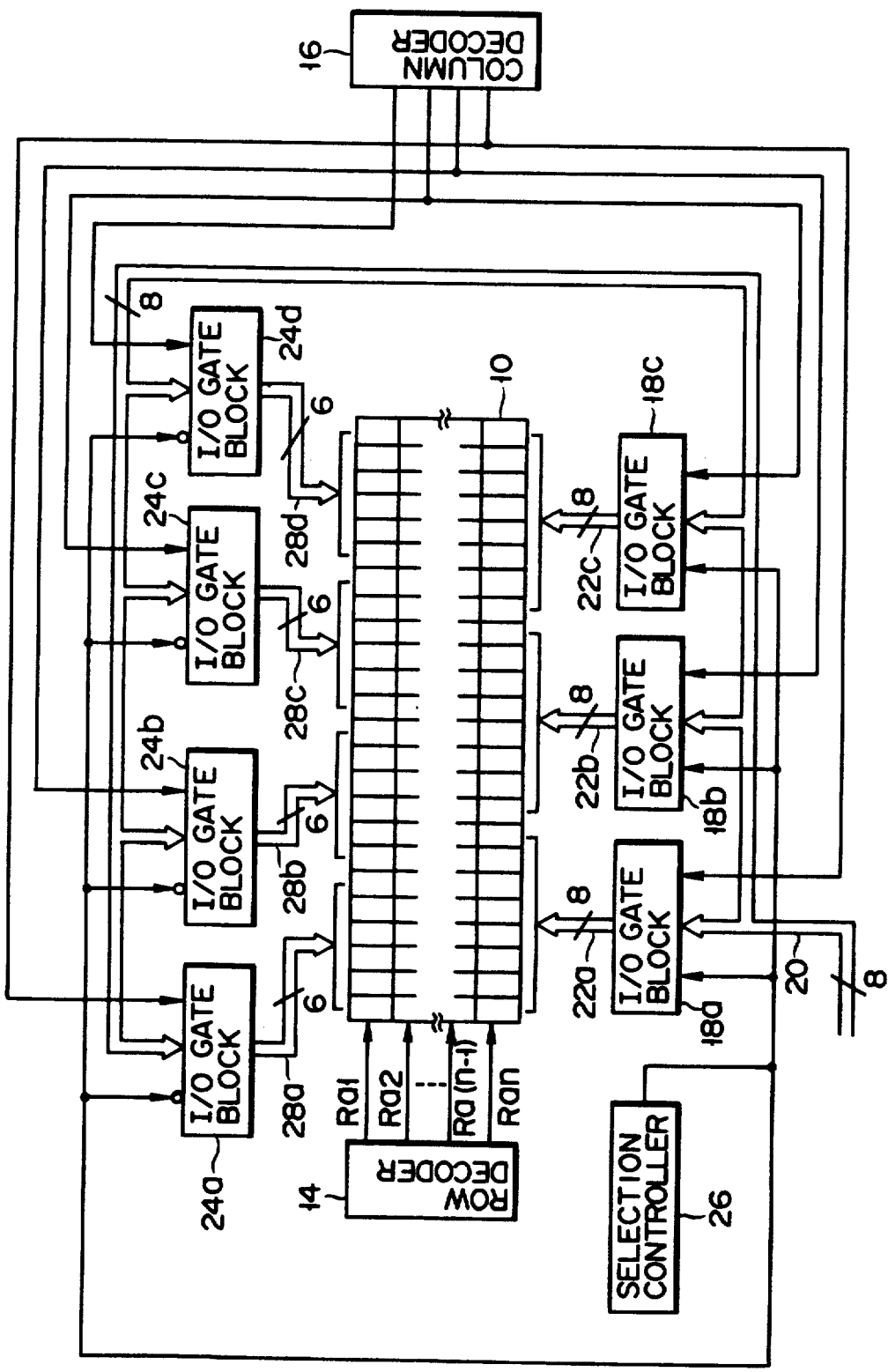
F I G. 4

| | | | | | | | | |
|---|---|---|---|---|---|---|---|---|
| D0b | ○ | – | – | × | ○ | | | |
| D1b | ○ | – | ○ | × | ○ | | | |
| D2b | – | – | × | ○ | – | | | |
| D3b | – | ○ | × | ○ | – | | | |
| D4b | – | × | ○ | – | – | | | |
| D5b | ○ | × | ○ | – | ○ | | | |
| D6b | × | ○ | – | – | × | | | |
| D7b | × | ○ | – | ○ | × | | | |
| D0a | | ○ | | | ○ | | | |
| D1a | | ○ | | | ○ | | | |
| D2a | | – | | | – | | | |
| D3a | | – | | | – | | | |
| D4a | | – | | | – | | | |
| D5a | | ○ | | | ○ | | | |
| D6a | | × | | | × | | | |
| D7a | | × | | | × | | | |
| CDa | ○ | ○ | ○ | – | ○ | ○ | ○ | – |
| CDb | ○ | ○ | – | ○ | ○ | ○ | – | ○ |
| CDc | ○ | – | ○ | ○ | ○ | – | ○ | ○ |
| CDd | – | ○ | ○ | ○ | – | ○ | ○ | ○ |
| 8/6 | | ○ | | | – | | | |

FIG. 11

DATA WRITE CONTROL CIRCUIT HAVING WORD LENGTH CONVERSION FUNCTION

BACKGROUND OF THE INVENTION

1. Field of the Invention

The present invention relates to a data write control circuit formed in a semiconductor integrated circuit to write data such as a character font in a RAM and, more particularly, to a data write control circuit having a word length conversion function for converting data having a word length of 8 bits into data having a word length of 6 bits.

2. Description of the Related Art

Conventionally, in a computer system and the like, a semiconductor integrated circuit having a data write control circuit is used to write font data of characters to be displayed on a screen in a text video RAM. This data write control circuit writes data in a RAM 10 having 24×8 bits as shown in FIG. 1. This RAM 10 is constituted by a plurality of cell blocks 12a1 to 12c8 each for storing data in units of 8 bits (8 bits/word).

The above data write control circuit has a row decoder 14 for outputting row selection signals Ra1 to Ra8 for performing selection in the row direction of the RAM 10, a column decoder 14 for controlling selection in the column direction of the RAM 10, and three I/O gate blocks 18a to 18c which are selectively activated to input/output data in units of 8 bits with respect to the RAM 10. An 8-bit data bus 20 is commonly connected to the input sides of the I/O gate blocks 18a to 18c, and 8-bit data buses 22a, 22b, and 22c are connected between the RAM 10 and the output sides of the blocks 18a, 18b, and 18c, respectively.

In the data write control circuit having the above arrangement, in order to write data in a certain cell block (e.g., 12a1), the column decoder 16 selects and activates the I/O gate block 18a corresponding to the cell block 12a1. The row decoder 14 selects rows within a predetermined range in the row direction of the RAM 10, i.e., outputs a row selection signal Ra1. As a result, the data is written from the data bus 20 in the cell block 12a1 via the I/O gate blocks 18a and 22a.

According to the above arrangement, no problem is posed when, for example, character font data of a Japanese character (kanji) constituted by 16×16 dots as shown in FIG. 2 is to be written in the RAM 10. However, the following problem is posed when data of a character font in which the number of dots in the lateral direction (row direction) is smaller than the number of bits in the column direction of each of the cell blocks 12a1 to 12cn such as a Japanese character (katakana) constituted by 5×7 dots as shown in FIG. 3 or an alphanumeric character font is to be written in the RAM 10.

Assume that four characters each represented by character font data having 5×7 dots are to be continuously written in three cell blocks in each row (e.g., the cell blocks 12a2 to 12c2 in the second row) as shown in FIG. 1. Firstly, the I/O gate block 18a corresponding to the cell blocks 12a2 to 12a8 in the first column array is selected and activated by the column decoder 16. The row decoder 14 sequentially selects rows (seven times) within a predetermined range in the row direction of the RAM 10 (e.g., rows corresponding to row selection signals Ra2 to Ra8). In correspondence with this selection, seven 8-bit data (70H, 88H, 88H, 88H, F8H, 88H, and 88H) each obtained by adding three bits of "0"s to lower positions of 5-bit data in a corresponding row of character font data representing "A" are sequentially given from the data bus 20 to the I/O gate blocks 18a to 18c. In this case, since the I/O gate block 18a is selected and activated by the column decoder 16 as described above, these 8-bit data are written in columns of the cell blocks 12a2 to 12a8 via the I/O gate block 18a and the data bus 22a in correspondence with the above selection. In this manner, the character font data representing "A" is written. Note that in the RAM 10 shown in FIG. 1, each black square represents data "1", and each white square represents data "0".

Assume that a character font subsequent to the character font "A" is determined to be "B". In this case, since character font data representing "B" extends over two lower bits of the data bus 22a and three upper bits of the data bus 22b, the column decoder 16 selects and activates the I/O gate block 18a corresponding to the cell blocks 12a2 to 12a8, and the row decoder 14 sequentially selects rows within a predetermined range in the row direction of the RAM 10. In correspondence with this selection, seven 8-bit data (73H, 8AH, 8AH, 8AH, FAH, 8AH, and 8BH) each obtained by adding one bit of "0" indicating "empty" and data of two upper bits in a corresponding row of the character font data "B" to upper positions of the 5-bit data in a corresponding row of the character font data "A" are sequentially supplied to the I/O gate blocks 18a to 18c via the data bus 20. Therefore, in correspondence with the above selection, these 8-bit data are written from the I/O gate block 18a in columns of the cell blocks 12a2 to 12a8 of the RAM 10 via the data bus 22a.

Subsequently, the column decoder 16 selects and activates the I/O gate block 18b corresponding to the cell blocks 12b2 to 12b8 in the second column array continuous to the cell blocks 12a2 to 12a8 in the first column array, and the row decoder 14 sequentially selects rows within a predetermined range in the row direction of the RAM 10. In correspondence with this selection, seven 8-bit data (C0H, 20H, 20H, C0H, 20H, 20H, and C0H) each obtained by adding five bits of "0"s to lower positions of three lower bits of the 5-bit data in a corresponding row of the character font data "B" are sequentially supplied to the I/O gate blocks 18a to 18c via the data bus 20. Therefore, in correspondence with the above selection, these 8-bit data are written from the I/O gate block 18b in columns of the cell blocks 12b2 to 12b8 of the RAM 10 via the data bus 22b. In this manner, the character font data "A" and "B" are written in the cell blocks in the two continuous column arrays.

Character font data representing "C" is written in the same manner as described above, and character font data representing "D" is similarly written, thereby completing writing of the character font data "A", "B", "C", and "D".

As is apparent from the above description, therefore, in order to continuously write four characters each represented by character font data having 5×7 dots in three column arrays of cell blocks in units of 8×7 bits, a cycle of seven row selection operations must be performed for the cell blocks in the three column arrays twice per cell block, i.e., a write operation must be performed by 7×3×2=42 times. As a result, software processing for this operation is complicated, and a write processing time is prolonged.

In consideration of the above situation, a data write control circuit as shown in FIG. 4 is conventionally developed. This data write control circuit has, in addition to the arrangement of the data write control circuit shown in FIG. 1 described above, a system for processing data in units of 6 bits (6 bits/word). That is, this data write control circuit has four 6-bit I/O gate blocks 24a to 24d which are selectively activated by a column decoder 16 to input/output data in units of 6 bits with respect to a RAM 10, and an 8/6-bit selection controller 26 for selecting either the 6-bit I/O gate blocks 24a to 24d or 8-bit I/O gate blocks 18a to 18c. An 8-bit data bus 20 is commonly connected to the input sides of the I/O gate blocks 24a to 24d, and 6-bit data buses 28a, 28b, 28c, and 28d are connected between the RAM 10 and the output sides of the I/O gate blocks 24a, 24b, 24c, and 24d, respectively. When 8-bit data is input as data to be written in the RAM 10, the 6-bit I/O gate blocks 24a to 24d nullify two upper bits of the input 8-bit data and output the data to the data buses 28a to 28d. When 6-bit data is input as readout data from the RAM 10, the 6-bit I/O gate blocks 24a to 24d add two bits of "0"s to upper positions of the 6-bit data and output the data as 8-bit data to the data bus 20.

In the data write control circuit having the above arrangement, in order to write data of a character font representing a character constituted by 16×16 dots, as shown in FIG. 2, in the RAM 10, the 8/6-bit selection controller 26 outputs an activation signal of the 8-bit I/O gate blocks 18a to 18c (an inactivation signal of the 6-bit I/O gate blocks 24a to 24d). The column decoder 16 selects and activates the 8-bit I/O gate block 18a, and a row decoder 14 sequentially selects rows (16 times) within a predetermined range (e.g., rows corresponding to row selection signals Ra1 to Ra16) in the row direction of the RAM 10. In correspondence with this selection, data of the upper half (8 bits) in each row of the character font data representing the character shown in FIG. 2 is supplied from the data bus 20 to the 8-bit I/O gate blocks 18a to 18c and written in columns connected to the 8-bit I/O gate block 18a selected by the column decoder 16.

Subsequently, the column decoder 16 selects and activates the 8-bit I/O gate block 18b, and the row decoder 14 sequentially selects rows within a predetermined range in the row direction of the RAM 10. In correspondence with this selection, data of the lower half (8 bits) in each row of the character font data representing the character as shown in FIG. 2 is supplied from the data bus 20 to the 8-bit I/O gate blocks 18a to 18c and written in columns connected to the 8-bit I/O gate block 18b selected by the column decoder 16. In this manner, the character font data representing the character as shown in FIG. 2 can be written in the RAM 10.

A write operation in which four characters such as "A", "B", "C", and "D" each represented by character font data having 5×7 dots are to be continuously written in units of 8×7 bits is performed as follows. That is, the 8/6-bit selection controller 26 outputs an activation signal for the 6-bit I/O gate blocks 24a to 24d (an inactivation signal for the 8-bit I/O gate blocks 18a to 18c). The column decoder 16 selects and activates the 6-bit I/O gate block 24a, and the row decoder 14 sequentially selects rows (7 times) within a predetermined range (e.g., rows corresponding to row selection signals Ra2 to Ra8) in the row direction of the RAM 10. In correspondence with this selection, data of each row of the character font data representing "A" is supplied from the data bus 20 to the 6-bit I/O gate blocks 24a to 24d. In this manner, valid 6-bit data is output as write data from the 6-bit I/O gate block 24a selected by the column decoder 16 to the data bus 28a, and the character font data "A" is written in the RAM 10.

Subsequently, the column decoder 16 selects and activates the 6-bit I/O gate block 24b, and the row decoder 14 sequentially selects rows within a predetermined range in the row direction of the RAM 10. In correspondence with this selection, data of each row of the character font data representing "B" is supplied from the data bus 20 to the 6-bit I/O gate blocks 24a to 24d, and valid 6-bit data is output as write data from the 6-bit I/O gate block 24b to the data bus 28b, thereby writing the character font data "B" in the RAM 10. In this case, the write operation of the character font data "B" can be performed without adversely affecting the character font data "A" which is already written.

By sequentially writing the character font data representing "C" and "D" in the same manner as described above, the character font data "A", "B", "C", and "D" can be continuously written in the RAM 10.

As described above, this data write control circuit has two systems, i.e., a system corresponding to a word length of 8 bits and a system corresponding to a word length of 6 bits. Therefore, in order to continuously write four characters each represented by character font data having 5×7 bits in the RAM 10, a cycle of seven column selection operations need only be performed for each of the four characters, i.e., a write operation need only be performed by 7×4=28 times. Therefore, the number of write operations can be largely reduced as compared with that of the data write control circuit as shown in FIG. 1. However, since this data write control circuit requires two systems of gate blocks, i.e., the 8-bit I/O gate blocks 18a to 18c and the 6-bit I/O gate blocks 24a to 24d, and two systems of data buses, i.e., the 8-bit data buses 22a to 22c and the 6-bit data buses 28a to 28d, its circuit arrangement is enlarged, and a required wiring region is widened. Therefore, a chip size is increased when this circuit is incorporated in an IC arrangement.

SUMMARY OF THE INVENTION

It is, therefore, an object of the present invention to provide a data write control circuit comprising a word length converter with a simple arrangement, which can continuously write character font data in a RAM by a smaller number of write operations regardless of whether the data has a word length of 8 or 6 bits, thereby simplifying corresponding software processing, reducing a write processing time, and suppressing an increase in circuit arrangement to suppress an increase in chip size when the circuit is incorporated in an IC arrangement.

In order to achieve the above object of the present invention, there is provided a data write control circuit for continuously writing 6-bit data given by 8 bits in a RAM having first to third 8-bit column arrays in each row, comprising: a row decoder for performing selection in the row direction of the RAM; a column decoder for performing selection in the column direction of the RAM; a mode selector for outputting a mode selection signal for performing selection between an 8-bit write mode and a 6-bit write mode; an 8-bit common data bus for supplying 8-bit data to be written in the RAM; a rotation controller for performing bit rotation in units of 2 bits for the 8-bit data supplied from the common data bus in correspondence with the mode selection signal and a column selection state of the column decoder and outputting the 8-bit data; first to third 8-bit data buses for supplying the 8-bit data output from the rotation controller; a first I/O gate block connected between the first data bus and the first 8-bit column array of the RAM and having gates of 8 bits; a second I/O gate block connected between the second data bus and the second 8-bit column array of the RAM and having gates of 8 bits; a third I/O gate block connected between the third data bus and the third 8-bit column array of the RAM and having gates of 8 bits, gates of 6 lower bits of the gates of 8 bits being activated by a predetermined decode output from the column decoder; a first gate controller, selectively activated by the column decoder, for (a) activating all of the gates of 8 bits in the first I/O gate block when the 8-bit write mode is selected by the mode selection signal from the mode selector, and (b) activating only gates of 6 upper bits of the gates of 8 bits in the first I/O gate block when the 6-bit write mode is selected by the mode selection signal; a second gate controller, selectively activated by the column decoder, for (a) activating all of the gates of 8 bits in the second I/O gate block when the 8-bit write mode is selected by the mode selection signal from the mode selector, and (b) activating only gates of 2 lower bits of the gates of 8 bits in the first I/O gate block and gates of 4 upper bits of the gates of 8 bits in the second I/O gate block when the 6-bit write mode is selected by the mode selection signal; and a third gate controller, selectively activated by the column decoder, for (a) activating all of the gates of 8 bits in the third I/O gate block when the 8-bit write mode is selected by the mode selection signal from the mode selector, and (b) activating only gates of 4 lower bits of the gates of 8 bits in the second I/O gate block and gates of 2 upper bits of the gates of 8 bits in the third I/O gate block when the 6-bit write mode is selected by the mode selection signal.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 4 is a block diagram showing an arrangement of another conventional data write control circuit;

FIG. 11 is a truth table for explaining an operation of the controller shown in FIG. 10.

DETAILED DESCRIPTION OF THE PREFERRED EMBODIMENT

Figure 5:
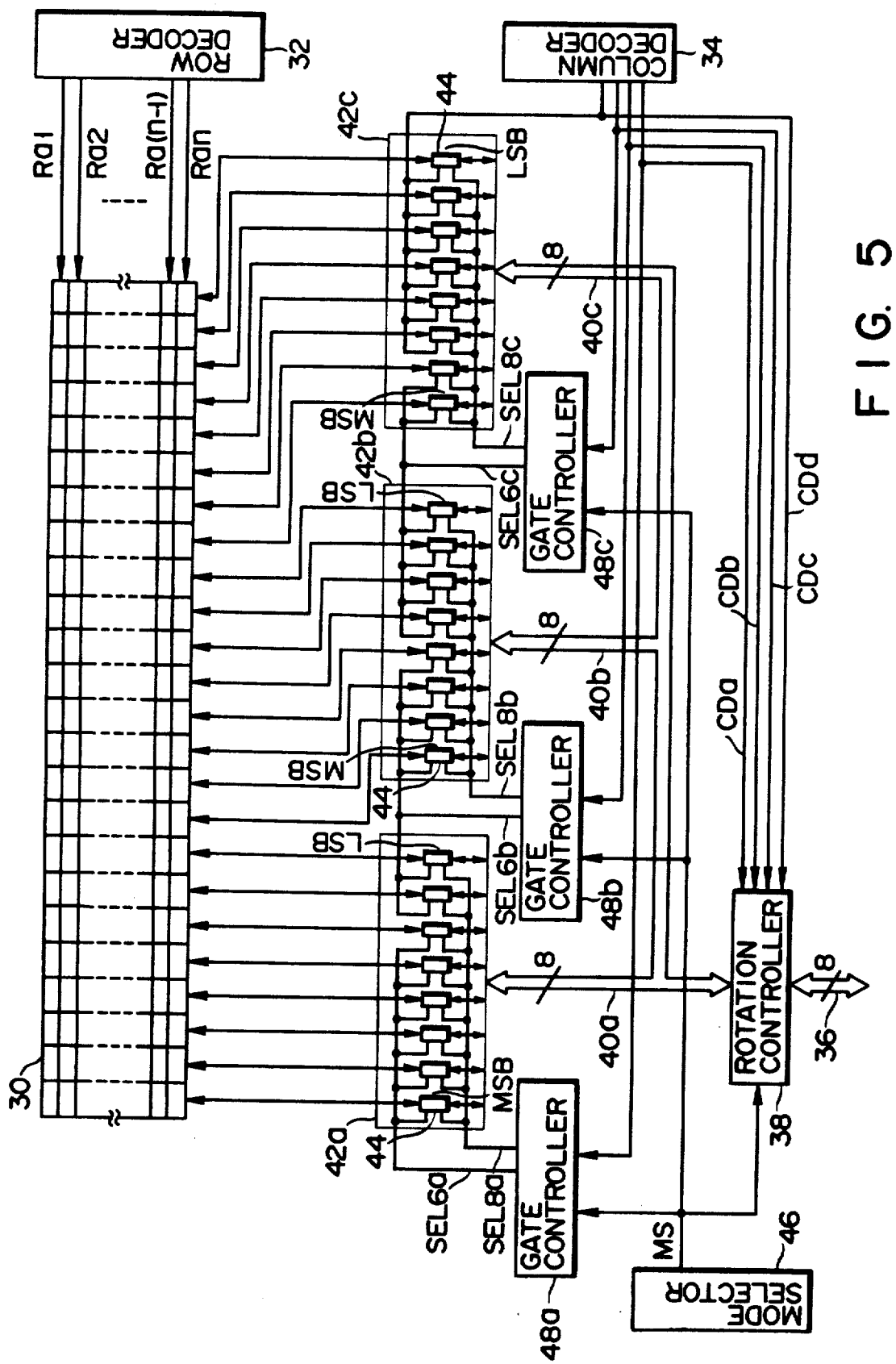
FIG. 5 is a block diagram showing an embodiment of a data write control circuit according to the present invention.

FIG. 5 shows an arrangement of a data write control circuit formed in a semiconductor integrated circuit to write data such as a character font. Referring to FIG. 5, a RAM 30 has, e.g., 24×n bits. A row decoder 32 decodes a row address signal supplied from, e.g., a CPU (not shown) and selectively activates n row selection signals Ra1 to Ran for performing selection in the row direction of the RAM 30. A column decoder 34 decodes a column address signal from, e.g., the CPU (not shown) and selectively activates four column selection signals CDa to CDd for controlling selection in the column direction of the RAM 30.

An 8-bit common data bus 36 supplies character font data output from, e.g., a character generator (not shown) to a rotation controller 38. The rotation controller 38 performs bit rotation for the character font data as will be described later and supplies the data to first to third I/O gate blocks 42a to 42c via first to third 8-bit data buses 40a to 40c, respectively.

The first I/O gate block 42a has gates 44 of 8 bits connected to columns (in this embodiment, first to eighth columns) of first 8 bits of the RAM 30. Similarly, the second I/O gate block 42b has gates 44 of 8 bits connected to columns (in this embodiment, ninth to 16th columns) of second 8 bits of the RAM 30, and the third I/O gate block 42c has gates 44 of 8 bits connected to columns (in this embodiment, 17th to 24th columns) of third 8 bits of the RAM 30.

A mode selector 46 outputs a mode selection signal MS for selecting an 8-bit write mode or a 6-bit write mode. For example, this signal MS goes to "1" when the 8-bit write mode is to be selected, and goes to "0" when the 6-bit write mode is to be selected.

A first gate controller 48a is selectively activated by the column decoder 34 and outputs an 8-bit selection signal SEL8a or a 6-bit selection signal SEL6a in accordance with the mode selection signal MS from the mode selector 46. That is, when the level of the signal MS from the selector 46 is "1", the controller 48a outputs the 8-bit selection signal SEL8a for activating the gates 44 of 8 bits in the first I/O gate block 42a. When the level of the signal MS from the selector 46 is "0", the controller 48a outputs the 6-bit selection signal for activating the gates 44 of 6 upper bits in the first I/O gate block 42a.

Similarly, a second gate controller 48b is selectively activated by the column decoder 34 and outputs an 8-bit selection signal SEL8b or a 6-bit selection signal SEL6b in accordance with the mode selection signal MS from the mode selector 46. That is, when the level of the signal MS from the selector 46 is "1", the controller 48b outputs the 8-bit selection signal SEL8b for activating the gates 44 of 8 bits in the second I/O gate block 42b. When the level of the signal MS from the selector is "0", the controller 48b outputs the 6-bit selection signal SEL6b for activating the gates 44 of 2 lower bits in the first I/O gate block 42a and the gates 44 of 4 upper bits in the second I/O gate block 42b.

Similarly, a third gate controller 48c is selectively activated by the column decoder 34 and outputs an 8-bit selection signal SEL8c or a 6-bit selection signal SEL6c in accordance with the mode selection signal MS from the mode selector 46. That is, when the level of the signal MS from the selector is "1", the controller 48c outputs the 8-bit selection signal SEL8c for activating the gates 44 of 8 bits in the third I/O gate block 42c. When the level of the signal MS from the selector 46 is "0", the controller 48c outputs the 6-bit selection signal SEL6c for activating the gates 44 of 4 lower bits in the second I/O gate block 42b and the gates 44 of 2 upper bits in the third I/O gate block 42c.

Note that the gates 44 of 6 lower bits in the third gate block 42c are activated by the column selection signal CDd from the column decoder 34.

In accordance with the four column selection signals CDa to CDd from the column decoder 34 and the mode selection signal MS from the mode selector 46, the rotation controller 38 does not perform bit rotation; performs 2-bit rotation; performs 4-bit rotation; or performs 6-bit rotation for the 8-bit data supplied via the common data bus 36, and outputs the data to the first to third data buses 40a to 40c.

Figure 1:
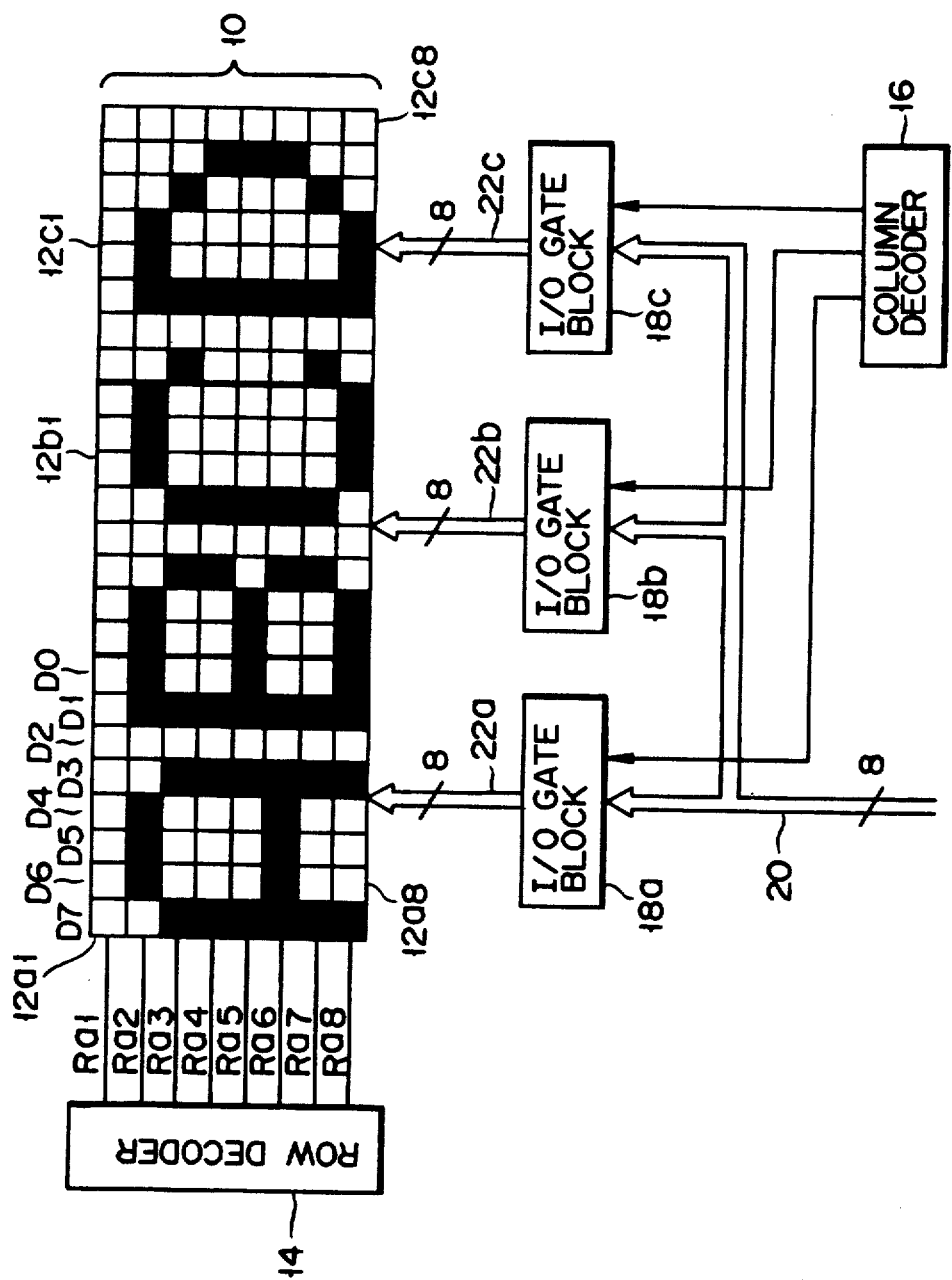
FIG. 1 is a block diagram showing an arrangement of a conventional data write control circuit, in which four characters each represented by character font having 5×7 dots are continuously written in a RAM.
Figure 2:
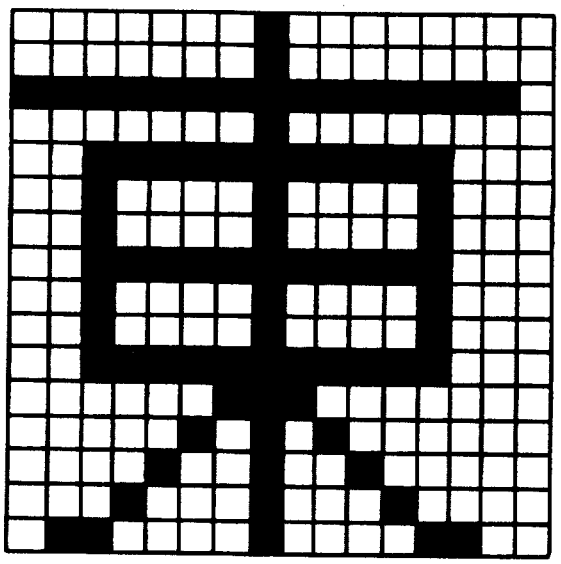
FIG. 2 is a view showing a practical character font having 16×16 dots input by the circuit shown in FIG. 1.
Figure 3:
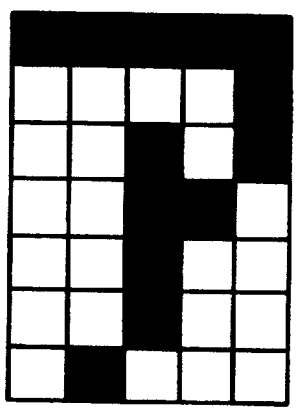
FIG. 3 is a view showing a practical character font having 5×7 dots input by the circuit shown in FIG. 1.

In the above arrangement, in order to write character font data having 16×16 dots as shown in FIG. 2 in the RAM 30, the mode selector 46 selects the 8-bit write mode to set the level of the mode selection signal MS to be "1" under the control of, e.g., a CPU (not shown). Subsequently, the row decoder 32 sequentially selects rows (16 times) within a predetermined range (e.g., rows corresponding to the row selection signals Ra1 to Ra16) in the row direction of the RAM 30. In correspondence with this selection, the CPU (not shown) sequentially supplies data of an upper half (8 bits) of each row of the 16×16-dot character font data generated by, e.g., a character generator (not shown) to the common data bus 36. In this case, since the 8-bit write mode is designated for the rotation controller 38 by the mode selection signal MS, the controller 38 directly outputs the 8-bit data of the common data bus 36 without performing bit rotation. The 8-bit output data is supplied to the first to third I/O gate blocks 42a to 42c via the first to third data buses 40a to 40c, respectively. In this case, in order to write the data in the first to eighth columns of the RAM 30, only the first gate controller 48a of the first to third gate controllers 48a to 48c is selectively activated by the column selection signal CDa from the column decoder 34. As a result, since the 8-bit write mode is designated for the first gate controller 48a by the mode selection signal MS, the controller 48a outputs the 8-bit selection signal SEL8a. Therefore, only the gates 44 of 8 bits in the first I/O gate block 42a of the first to third I/O gate blocks 42a to 42c are activated. As a result, data of the upper half (8 bits) of the 16×16-dot character font data is written in the RAM 30.

Subsequently, the row decoder 32 sequentially selects rows in the above predetermined range in the row direction of the RAM 30. In correspondence with this selection, data of the lower half (8 bits) of each row of the 16×16-dot character font data is sequentially supplied to the common data bus 36. This 8-bit data of the common data bus 36 is supplied to the first to third I/O gate blocks 42a to 42c via the first to third data buses 40a to 40c, respectively, without being subjected to bit rotation performed by the rotation controller 38. In this case, in order to write the data in the ninth to 16th columns of the RAM 30, only the second gate controller 48b of the first to third gate controllers 48a to 48c is selected and activated by the column selection signal CDb from the column decoder 34. As a result, since the 8-bit write mode is designated for the second gate controller 48b, the controller 48b outputs the 8-bit selection signal SEL8b. Therefore, only the gates 44 of 8 bits in the second I/O gate blocks 42b of the first to third I/O gate blocks 42a to 42c are activated. As a result, the data of the lower half (8 bits) of the 16×16-dot character font data is written in the RAM 30. In this manner, the 16×16-dot character font data is written in the RAM 30.

A write operation in which four characters such as "A", "B", "C", and "D" each represented by character font data having 5×7 dots are to be continuously written in units of 8×7 bits will be described in detail below with reference to FIGS. 6 to 9. Note that in FIGS. 6 to 9, each black square represents data "1", each white square represents data "0", and each square having "x" therein represents invalid data.

Figure 6:
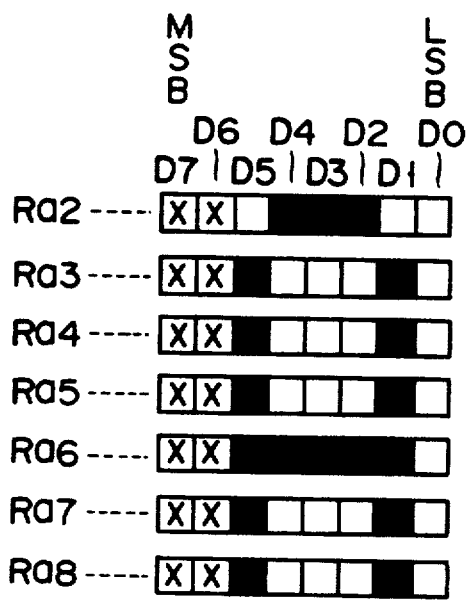
FIG. 6 is a view showing input data of a first character obtained when four characters each represented by a character font having 5×7 dots are to be continuously written by the circuit shown in FIG. 5.
Figure 7:
FIG. 7 is a view showing write data of a first character obtained when four characters each represented by a character font having 5×7 dots are to be continuously written by the circuit shown in FIG. 5.

Firstly, the row decoder 32 sequentially selects rows (7 times) within a predetermined range in the row direction of the RAM 30. In correspondence with this selection, 8-bit data (including invalid data in 2 upper bits) of each row of the character font data representing "A" as shown in FIG. 6 is sequentially supplied to the common data bus 36. In this case, if the 6-bit write mode is selected by the mode selector 46, the rotation controller 38 set in the 6-bit write mode performs 2-bit rotation in accordance with the column selection signal CDa and outputs character font data "A" as shown in FIG. 7. That is, the invalid data "x" of 2 upper bits are shifted to 2 lower bits, and 6 upper bits become valid data.

This output from the rotation controller 38 is supplied to the first to third I/O gate blocks 42a to 42c via the first to third data buses 40a to 40c, respectively. In this case, in order to write the data in the first to sixth columns of the RAM 30, only the first gate controller 48a of the first to third gate controllers 48a to 48c is selected and activated by the column selection signal CDa from the column decoder 34. Since the 6-bit write mode is designated for the first gate controller 48a, the controller 48a outputs the 6-bit selection signal SEL6a. Therefore, only the gates 44 of 6 upper bits in the first I/O gate block 42a of the first to third I/O gate blocks 42a to 42c are activated. As a result, only the valid data of the 6 upper bits shown in FIG. 7 is written in the RAM 30. In this manner, the character font data representing "A" is written in the RAM 30.

Figure 8:
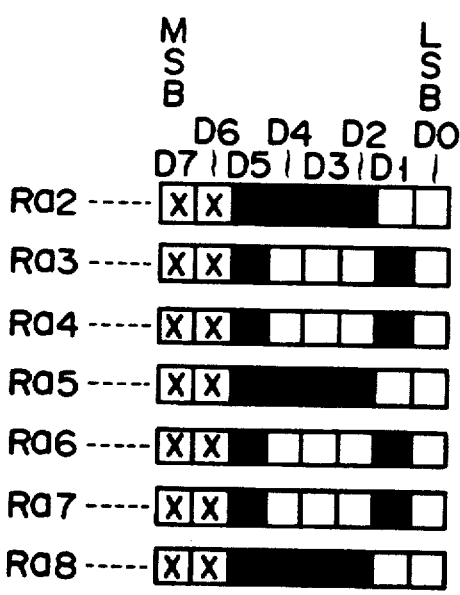
FIG. 8 is a view showing input data of a second character obtained when four characters each represented by a character font having 5×7 dots are to be continuously written by the circuit shown in FIG. 5.
Figure 9:
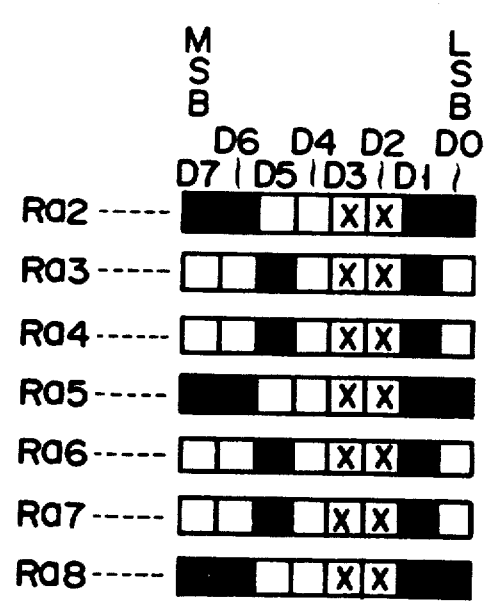
FIG. 9 is a view showing write data of a second character obtained when four characters each represented by a character font having 5×7 dots are to be continuously written by the circuit shown in FIG. 5.

In order to write the character font data representing "B" adjacent to the character font data "A", the row decoder 32 sequentially selects rows (seven times) in the predetermined range in the row direction of the RAM 30. In correspondence with this selection, 8-bit data including invalid data "x" in 2 upper bits) in each row of the character font data "B" as shown in FIG. 8 is sequentially supplied to the common data bus 36. In this case, since the 6-bit write mode is selected by the mode selector 46, the rotation controller 38 set in the 6-bit write mode performs 4-bit rotation in correspondence with the column selection signal CDb and outputs data as shown in FIG. 9. That is, the invalid data "x" of 2 upper bits are shifted to the fourth and third bits, and the 4 upper bits and 2 lower bits become to valid data.

The output from the rotation controller 38 is supplied to the first to third I/O gate blocks 42a to 42c via the first to third data buses 40a to 40c, respectively. In this case, in order to write the data in the 7th to 12th columns of the RAM 30, only the second gate controller 48b of the first to third gate controllers 48a to 48c is selected and activated by the column selection signal CDb from the column decoder 34. Since the 6-bit write mode is designated for the second gate controller 48b, the controller 48b outputs the 6-bit selection signal SEL6b. Therefore, of the first to third I/O gate blocks 42a to 42c, only the gates 44 of the 2 lower bits in the first I/O gate block 42a and the gates 44 of the 4 upper bits in the second I/O gate block 42b are activated. As a result, the valid data of the 2 lower bits and the 4 upper bits shown in FIG. 9 are written in the RAM 30 in correspondence with the activated gates 44. In this manner, the character font data "B" is written in the RAM 30.

Subsequently, in the same manner as described above, the character font data representing "C" is subjected to 6-bit rotation and written in the 13th to 18th columns of the RAM 30, and the character font data representing "D" is written in the 19th to 24th columns of the RAM 30 without performing bit rotation. In this manner, the character font data "A", "B", "C", and "D" are continuously written in the RAM 30.

That is, according to the data write control circuit of this embodiment, the execution/inexecution and the type of bit rotation in the rotation controller 38 are selectively set in correspondence with the positions and the number of gates selected from the 24 gates 44. Therefore, externally supplied 8-bit data can be written in the RAM 30 directly or after it is automatically subjected to word-length conversion into 6-bit data. In this case, the number of write operations performed in order to directly write character font data having 16×16 dots corresponds to two arrays of 16 row selection operations, i.e., 16×2=32. The number of write operations performed in order to write four characters each represented by character font data having 5×7 bits after word-length conversion corresponds to seven column array selection operations for each character, i.e., 7×4=28. In this manner, since only a small number of write operations need be performed in order to continuously write character font data regardless of whether its bit length is 8 or 6 bits, associated software processing can be simplified and a write processing time can be shortened.

In addition, the data write control circuit according to this embodiment includes the rotation controller 38, and the execution/inexecution and the type of bit rotation of the controller 38 are controlled in association with mode selection and gate control. Therefore, 8-bit data can be directly written or automatically subjected to word-length conversion. As a result, unlike conventional data write control circuits, this data write control circuit does not require two systems of gate blocks, i.e., 8-bit I/O gate blocks and 6-bit I/O gate blocks or two systems of data buses, i.e., 8-bit data buses and 6-bit data buses. Therefore, since an increase in circuit arrangement and an increase in necessary wiring region can be suppressed, an increase in chip size can be suppressed when the circuit is incorporated in an IC arrangement.

Figure 10:
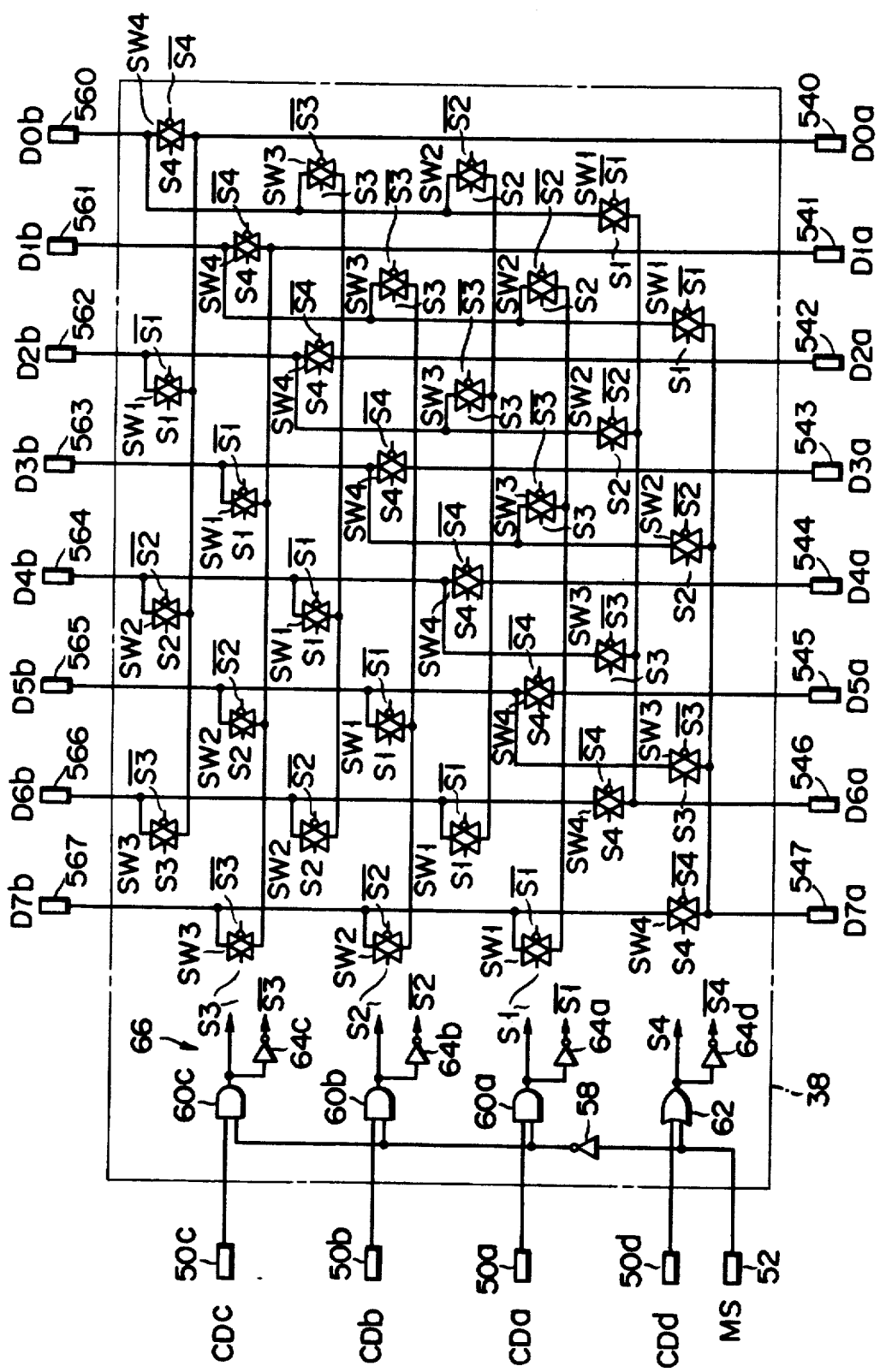
FIG. 10 is a circuit diagram showing a practical arrangement of a rotation controller shown in FIG. 5.

FIG. 10 shows a practical arrangement of the rotation controller 38 having a plurality of I/O terminals. That is, column decode signal I/O terminals 50a to 50d receive the column selection signals CDa to CDd from the column decoder 34. A mode selection signal input terminal 52 receives the mode selection signal MS from the mode selector 46. Data input terminals 540 to 547 receive 8-bit data from the common data bus 36. Data output terminals 560 to 567 output 8-bit data from the rotation controller 38 to the first to third data buses 40a to 40c.

The mode selection signal MS received by the mode selection signal input terminal 52 is inverted by an inverter 58 and supplied to one input terminal of each of first to third AND gates 60a to 60c. The other input terminals of each of the AND gates 60a to 60c receives a corresponding on of the column selection signals CDa to CDc received by a corresponding one of the column decode signal input terminals 50a to 50c. The mode selection signal MS received by the mode selection signal input terminal 52 is supplied to one input terminal of an OR gate 62. The other input terminal of the OR gate 62 receives the column selection signal CDd received by the column decode signal input terminal 50d. Outputs from the first to third AND gates 60a to 60c and the OR gate 62 are used as first to fourth switch signals S1 to S4. The switch signals S1 to S4 are inverted into first to fourth inverted switch signals S1 to S4 by corresponding inverters 64a to 64d, respectively. That is, the first to third AND gates 60a to 60c, the OR gate 62, and the inverters 64a to 64d constitute a switch controller 66.

2-bit shifting first analog switches SW1 are inserted between the data input terminals 540 to 547 and the data output terminals 562 to 567, 560, and 561. These eight first analog switches SW1 are controlled by the complementary first switch signal S1 and first inverted switch signal S1.

4-bit shifting second analog switch SW2 are inserted between the data input terminals 540 to 547 and the data output terminals 564 to 567 and 560 to 563. These eight second analog switches SW2 are controlled by the complementary second switch signal S2 and second inverted switch signal S2.

6-bit shifting third analog switches SW3 are inserted between the data input terminals 540 to 547 and the data output terminals 566, 567, and 560 to 565. These eight third analog switches SW3 are controlled by the complementary third switch signal S3 and third inverted switch signal S3.

Fourth analog switches SW4 are inserted between the data input terminals 540 to 547 and the data output terminals 560 to 567. These eight fourth analog switches are controlled by the complementary fourth switch signal S4 and fourth inverted switch S4.

FIG. 11 shows a truth table for explaining an operation of the rotation controller 38 having the above arrangement, and the operation will be described below with reference to this truth table. Assume that input data D7a to D0a of the data input terminals 547 to 540 are, e.g., "xx01110". At this time, if the mode selection signal MS received by the mode selection signal input terminal 52 is at inactivation level "0" (i.e., a 6-bit mode selection state) and the column selection signals CDd to CDa received by the column decode signal input terminals 50a to 50d are "0", "0", "0", and "1", respectively, the fourth to first switch signals S4 to S1 correspondingly go to "0", "0", "0", and "1", respectively. As a result, of the 32 analog switches SW4 to SW1, only the 2-bit shifting eight first analog switches SW1 controlled by the first switch signal S1 and the first inverted switch signal S1 are turned on and the remaining 24 analog switches SW4 to SW2 are turned off. Therefore, output data D7b to D0b from the data output terminals 567 to 560 become "011100xx".

In this case, if the column selection signals CDd to CDa are "0", "0", "1", and "0", the fourth to first switch signals S4 to S1 correspondingly go to "0", "0", "1", and "0". As a result, of the 32 analog switohes SW4 to SW1, only the 4-bit shifting eight second analog switches SW2 controlled by the second switch signal S2 and the second inverted switch signal S2 are turned on, and the remaining 24 analog switches SW1, SW3, and SW4 are turned off. Therefore, the output data D7b to D0b from the data output terminals 567 to 560 become "1100xx01".

If the column selection signals CDd to CDa are "0", "1", "0", and "0", the fourth to first switch signals S4 to S1 correspondingly go to "0", "1", "0", and "0". As a result, of the 32 analog switches SW4 to SW1, only the 6-bit shifting eight first analog switches SW3 controlled by the third switch signal S3 and the third inverted switch signal S3 are turned on, and the remaining 24 analog switches SW1, SW2, and SW4 are turned off. Therefore, the output data D7b to D0b from the data output terminals 567 to 560 become "00xx0111".

If the column selection signals CDd to CDa are "1", "0", "0", and "0", the fourth to first switch signals S4 to S1 correspondingly go to "1", "0", "0", and "0". As a result, of the 32 analog switches SW4 to SW1, only the eight fourth analog switches SW4 controlled by the fourth switch signal S4 and the fourth inverted switch signal S4 are turned on, and the remaining 24 analog switches SW1 to SW3 are turned off. Therefore, the data D7b to D0b from the data output terminals 567 to 560 become "xx011100".

If, however, the mode selection signal MS is at activation level "1" (i.e., an 8-bit mode selection state), the fourth to first switch signals S4 to S1 accordingly go to "1", "0", "0", and "0" regardless of the column selection signals CDd to CDa. As a result, of the 32 analog switches SW4 to SW1, only the eight fourth analog switches SW4 controlled by the fourth switch signal S4 and the fourth inverted switch signal S4 are turned on, and the remaining 24 analog switches SW1 to SW3 are turned off. Therefore, the output data D7b to D0b from the data output terminals 567 to 560 becomes "xx011100".

In this manner, the rotation controller 38 performs bit rotation.

As has been described above in detail, according to the data write control circuit of the present invention, character font data can be continuously written in a RAM by a small number of write operations regardless of whether the word length of the data is given as 8 or 6 bits. Therefore, associated software processing can be simplified, and a write processing time can be shortened. In addition, an increase in number of circuit elements can be suppressed to suppress an increase in chip size when the controller is incorporated in an IC arrangement. This effect becomes more significant as the number of bits in the column direction of a RAM is increased.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A data write control circuit for continuously writing 6-bit data given by 8 bits in a RAM having a first, second, and third 8-bit column array in each row, comprising:

a row decoder for performing selection in a row direction of said RAM;

a column decoder for performing selection in a column direction of said RAM;

a mode selector for outputting a mode selection signal for performing selection between an 8-bit write mode and a 6-bit write mode;

an 8-bit common data bus for carrying 8-bit data to be written in said RAM;

a rotation controller for performing bit rotation in units of 2 bits for the 8-bit data supplied from said 8-bit common data bus in correspondence with the mode selection signal and a column selection state of said column decoder and for outputting the 8-bit data;

first, second, and third 8-bit data buses for supplying the 8-bit data output from said rotation controller;

a first I/O gate block connected between said first 8-bit data bus and said first 8-bit column array of said RAM and having gates of 8 bits;

a second I/O gate block connected between said second 8-bit data bus and said second 8-bit column array of said RAM and having gates of 8-bits;

a third I/O gate block connected between said third 8-bit data bus and said third 8-bit column array of said RAM and having gates of 8-bits, gates of 6 lower bits of said gates of 8 bits being activated by a predetermined decode output from said column decoder;

a first gate controller, selectively activated by said column decoder, for
(a) activating all of said gates of 8-bits in said first I/O gate block when the 8-bit write mode is selected by the mode selection signal from said mode selector, and
(b) activating only gates of 6 upper bits of said gates of 8-bits in said first I/O gate block when the 6-bit write mode is selected by the mode selection signal;

a second gate controller, selectively activated by said column decoder, for
(a) activating all of said gates of 8 bits in said second I/O gate block when the 8-bit write mode is selected by the mode selection signal from said mode selector, and
(b) activating only gates of 2 lower bits of said gates of 8 bits in said first I/O gate block and gates of 4 upper bits of said gates of 8 bits in said second I/O gate block when the 6-bit write mode is selected by the mode selection signal; and a third gate controller, selectively activated by said column decoder, for
  (a) activating all of said gates of 8 bits in said third I/O gate block when the 8-bit write mode is selected by the mode selection signal from said mode selector, and
  (b) activating only gates of 4 lower bits of said gates of 8 bits in said second I/O gate block and gates of 2 upper bits of said gates of 8 bits in said third I/O gate block when the 6-bit write mode is selected by the mode selection signal.

2. The circuit according to claim 1, wherein
said column decoder outputs first, second, third, and fourth column selection signals for performing selection in the column direction of said RAM,
said first gate controller is activated by the first column selection signal from said column decoder,
said second gate controller is activated by the second column selection signal from said column decoder,
said third gate controller is activated by said third column selection signal from said column decoder, and
gates of 6 lower bits of said gates of 8 bits in said third I/O gate block are activated by the fourth column selection signal from said column decoder.

3. The circuit according to claim 2, wherein
said rotation controller directly outputs the 8-bit data supplied from said 8-bit command data bus without performing bit rotation for the 8-bit data when the 8-bit write mode is selected by the mode selection signal from said mode selector,
performs bit rotation of 2 bits for the 8-bit data supplied from said 8-bit common data bus and outputs the 8-bit data when the 6-bit write mode is selected by the mode selection signal and the first column selection signal is supplied from said column decoder,
performs bit rotation of 4 bits for the 8-bit data supplied from said 8-bit common data bus and outputs the 8-bit data when the 6-bit write mode is selected by the mode selection signal and the second column selection signal is supplied from said column decoder,
performs bit rotation of 6 bits for the 8-bit data supplied from said 8-bit common data bus and outputs the 8-bit data when the 6-bit write mode is selected by the mode selection signal and the third column selection signal is supplied from said column decoder, and
directly outputs the 8-bit data supplied from said 8-bit common data bus without performing bit rotation for the 8-bit data when the 6-bit write mode is selected by the mode selection signal and the fourth column selection signal is supplied from said column decoder.

4. The circuit according to claim 3, wherein said rotation controller includes:
first through eight data input terminals for receiving the 8-bit data from said 8-bit common data bus;
first through eighth data output terminals for outputting data to said first, second, and third 8-bit data buses;
a first plurality of eight analog switches connected to shift data by 2 bits between said first through eighth data input terminals and said first through eighth data output terminals;
a second plurality of eight analog switches connected to shift data by 4 bits between said first through eighth data input terminals and said first through eighth data output terminals;
a third plurality of eight analog switches connected to shift data by 6 bits between said first through eighth data input terminals and said first through eighth data output terminals;
a fourth plurality of eight analog switches connected to not generate any bit shift between said first through eighth data input terminals and said first through eighth data output terminals; and
a switch controller for controlling said first, second, third, and fourth plurality of eight analog switches in correspondence with the mode selection signal from said mode selector and the first, second, third, and fourth column selection signals from said column decoder.

5. The circuit according to claim 4, wherein said first plurality of eight analog switches include
  (a) six analog switches connected between said first through sixth data input terminals and said third through eighth data output terminals,
  (b) one analog switch connected between said seventh data input terminal and said first data output terminal, and
  (c) one analog switch connected between said eight data input terminal and said second data output terminal;
said second plurality of eight analog switches include
  (a) four analog switches connected between said first through fourth data input terminals and said fifth through eighth data output terminals, and
  (b) four analog switches connected between said fifth through eighth data input terminals and said first through fourth data output terminals;
said third plurality of eight analog switches include
  (a) two analog switches connected between said first data input terminal and said seventh data output terminal and between said second data input terminal and said eighth data output terminal, and
  (b) six analog switches connected between said third through eighth data input terminals and said first through sixth data output terminals; and
said fourth plurality of eight analog switches include
  (a) eight analog switches connected between said first through eight data input terminals and said first through eighth data input terminals and said first through eighth data output terminals.

6. The circuit according to claim 5, wherein
the mode selection signal from said mode selector is at level "1" in the 8-bit write mode and at level "0" in the 6-bit write mode, and
the first, second, third, and fourth column selection signals from said column decoder go to "1" only when a corresponding column array is selected.

7. The circuit according to claim 6, wherein said switch controller includes:
a first logic circuit for calculating a logical product of an inverted signal of the mode selection signal from said mode selector and the first column selection signal from said column decoder and for outputting a first switch signal for controlling said first plurality of eight analog switches;
a second logic circuit for calculating a logical product of the inverted signal of the mode selection signal from said mode selector and the second column selection signal from said column decoder and for outputting a second switch signal for controlling said second plurality of eight analog switches;

a third logic circuit for calculating a logical product of the inverted signal of the mode selection signal from said mode selector and the third column selection signal from said column decoder and for outputting a third switch signal for controlling said third plurality of eight analog switches; and a fourth logic circuit for calculating a logical sum of the mode selection signal from said mode selector and the fourth column selection signal from said column decoder and for outputting a fourth switch signal for controlling said fourth plurality of eight analog switches.

* * * * *